United States Patent [19]
Vlahos

[11] Patent Number: 5,231,598
[45] Date of Patent: Jul. 27, 1993

[54] DIRECT DIGITAL SYNTHESIS MEASUREMENT SIGNAL SKEW TESTER

[75] Inventor: Harry Vlahos, Visalia, Calif.

[73] Assignee: National Semiconductor Corporation, Santa Clara, Calif.

[21] Appl. No.: 769,940

[22] Filed: Sep. 30, 1991

[51] Int. Cl.$^5$ ............................................. G04F 15/20
[52] U.S. Cl. .................................. 364/569; 364/579; 364/580; 364/721; 364/488; 371/1; 371/24; 324/76.82; 324/76.83
[58] Field of Search ............... 364/569, 578, 486, 718, 364/820, 488, 579, 721, 580, 582; 371/1, 23, 24, 25.1; 324/83 R, 83 D, 76.82, 76.83; 250/558; 307/321

[56] References Cited

U.S. PATENT DOCUMENTS

| | | | |
|---|---|---|---|
| 3,248,572 | 4/1966 | Widmer | 307/321 |
| 3,800,280 | 3/1974 | Heffner | 371/1 |
| 4,484,296 | 11/1984 | Treise et al. | 364/721 |
| 4,497,056 | 1/1985 | Sugamori | 371/1 |
| 4,577,318 | 3/1986 | Whitacre et al. | 371/1 |
| 4,620,302 | 10/1986 | Binoeder et al. | 371/1 |
| 4,677,618 | 6/1987 | Haas et al. | 371/1 |
| 4,700,321 | 10/1987 | Ward | 364/569 |
| 4,809,205 | 2/1989 | Freeman | 364/721 |
| 4,975,634 | 12/1990 | Shohet | 324/83 R |
| 5,075,878 | 12/1991 | Ohtomo et al. | 364/569 |
| 5,166,629 | 11/1992 | Watkins et al. | 364/721 |

FOREIGN PATENT DOCUMENTS 0209370  9/1986  Japan ..................... 371/1

OTHER PUBLICATIONS

E. A. Crowther, Skew Measuring Circuit, Feb. 1971, vol. 13, No. 9.

Primary Examiner—Jack B. Harvey
Assistant Examiner—Hal D. Wachsman
Attorney, Agent, or Firm—Daniel H. Kane; James W. Rose; Richard C. Calderwood

[57] ABSTRACT

A skew tester (60) measures output timing skew parameters OSHL and OSLH between multiple output signals of an integrated circuit (IC) device under test (DUT) having an input and multiple outputs. A measurement signal generating circuit (15,16,18,20) generates a square wave measurement signal at a test signal frequency synchronized with a clock signal. The measurement signal generating circuit uses direct digital synthesis to provide a specified phase shift resolution. A test signal generating circuit (15,22,24) generates a square wave test signal at the test signal frequency using the same clock signal. The test signal and measurement signal are therefore synchronized in frequency. The test signal is applied to the input of a DUT (25) and a switch (30) selects one of the DUT output signals. The selected output signal and the square wave measurement signal are applied to the inputs of a comparator (45) which generates an output according to the difference in phase between the selected output signal and measurement signal. A threshold detector circuit (50) delivers a count signal in response to an output from the comparator (45) related to a threshold level. A programmable controller (12) is programmed to shift the phase of the measurement signal toward the phase of the selected output signal in phase increments or steps equal to the specified phase shift resolution during occurrence of count signals. The microcontroller counts phase shift increments to a maximum count (MAXCOUNT) at which the phase of corresponding edges substantially coincide and generates a skew number for comparison with skew numbers from the other multiple outputs and for calculating skew parameters OSHL and OSLH.

25 Claims, 9 Drawing Sheets

DIRECT DIGITAL SYNTHESIS MEASUREMENT SIGNAL SKEW TESTER

TECHNICAL FIELD

This invention relates to a new skew tester for testing output timing skew between multiple output signals of an integrated circuit (IC) device under test (DUT) having an input and multiple outputs. The invention uses direct digital synthesis of a measurement signal for high resolution phase measurement of phase differences between the measurement signal and respective output signals. The resulting skew numbers are used for determining maximum output timing skew or skew parameters OSLH, OSHL for the multiple output signals. The invention is used for measuring output timing skew of, for example, one bit to eight bit or other multiple bit clock drivers. It is particularly intended for skew testing high speed low skew parts and devices, and is applicable for bipolar, CMOS and BICMOS devices.

BACKGROUND ART

A standard definition of an output skew parameter OSLH for an IC clock driver circuit having a primary clock signal input and at least two secondary clock signal outputs is illustrated in FIG. 1. According to this definition, the single clock input signal provides a time zero reference $t_o$ for measuring propagation time tplh from the clock input signal at time $t_o$ to a specified point in the low to high (LH) transition at the selected output. Because of different characteristics of the multiple signal paths a range of different propagation times tplh for the secondary clock signals at the multiple outputs can be expected. The output skew parameter OSLH is the maximum difference in propagation times tplh between any two of the outputs of the multiple output clock driver circuit. Referring to FIG. 1, if the propagation time for the output signal on output 1 is the smallest propagation time $tplh_{min}$, and the propagation time tplh for the output signal on output 2 is the greatest propagation time $tplh_{max}$, then the output skew parameter OSLH for the device may be defined as:

$$OSLH = tplh_{max} - tplh_{min}.$$

Similarly the output skew parameter OSHL for high to low transitions HL is defined as $$OSHL = tphl_{max} - tphl_{min}.$$

It is noted that the output skew parameters OSLH and OSHL represent the timing skew or timing difference between the multiple output edges themselves without any necessary reference to the time $t_o$ of the corresponding input signal edge. A conventional device for measuring the output skew parameters OSLH and OSHL is the MCT Tester, a microprocessor controlled digital IC tester described for example in the *MCT 2000R TEST SYSTEMS HARDWARE MANUAL*, Publication No. 010193B, Revision B, Nov. 1, 1986, © 1986 MCT, Micro Component Technology Inc., 38 North Victoria Street, P.O. Box 64013, St. Paul, Minn. 55164. A disadvantage of the MCT Tester and other conventional testers is that output timing skew between multiple outputs signals cannot be measured directly. Rather, signal propagation times tplh and tphl are measured with reference to an input signal. Output skew is therefore a derivative parameter subject to the variables in measurement of separate propagation times through the part from input to multiple outputs.

A further problem with such conventional testers is the limited bandwidth and limited resolution available for testing. As the speed of IC parts and devices has increased, equalling and exceeding the speed of the tester, large errors in testing measurement occur. For example, the tester oscilloscope has a certain limited rise time as does the device under test. As the rise time of the DUT part approaches the rise time of the tester the result is increasing error in the rise time of output signals displayed on the screen. Skew testing for high speed low skew parts in particular eludes conventional testers.

OBJECTS OF THE INVENTION

It is therefore an object of the present invention to provide a new output signal skew tester and method for high resolution testing and measurement of the output skew parameters for IC devices having an input and multiple outputs. The invention is intended for skew testing of high speed low skew parts and maximizes bandwidth and speed of the skew tester to facilitate high resolution testing and measurement.

Another object of the invention is to measure output skew by high resolution phase measurement of phase differences between the respective output signals and a digitally synthesized measurement signal. According to the invention the digitally synthesized measurement signal is constructed with high phase shift increment resolution for achieving high resolution measurement of phase difference between the measurement signal and respective output signals.

A further object of the invention is to provide high resolution output timing skew measurement between output signals themselves without reference to the input signal time. Thus, it is not necessary to measure propagation times through the device from input to multiple outputs. Additionally the invention improves edge resolution of the respective output signals for improving determination of maximum output skew parameters OSLH and OSHL.

DISCLOSURE OF THE INVENTION

In order to accomplish these results the skew tester invention provides a system clock for generating a clock signal. A measurement signal generating circuit generates a square wave measurement signal at a test signal frequency synchronized with the clock signal. The measurement signal generating circuit generates a square wave measurement signal having at least a specified phase shift resolution of phase shift increments. A test signal generating circuit generates a square wave test signal at the test signal frequency using the same clock signal so that the test signal and measurement signal are synchronized in frequency.

According to the invention a DUT coupling circuit couples an input and multiple outputs of a DUT in the skew tester for driving an input of the DUT with the test signal. A multiple input switch such as a single pole multi-throw (SPMT) switch is coupled to the multiple outputs of the DUT and selects an output signal from one of the multiple outputs. The selected output signal and the measurement signal are processed and coupled respectively to first and second inputs of a phase comparator. The comparator generates an output according to the difference in phase between the selected output signal and the measurement signal. A threshold detector circuit is coupled to the output of the comparator for delivering a count signal in response to an output from the comparator in excess of a threshold level.

The invention provides a programmable controller coupled to the threshold detector circuit and to the measurement signal generating circuit. The controller is programmed for shifting the phase of the measurement signal toward the phase of the selected output signal in phase shift increments or steps equal to the specified phase shift resolution of the measurement signal during occurrence of count signals from the threshold detector circuit. The controller counts the phase shift increments to a maximum count MAXCOUNT at which the phase of an edge of a pulse of the measurement signal substantially coincides with the phase of a corresponding edge of a pulse of the selected output signal causing the output of the comparator to fall below the threshold of the threshold detector circuit. The controller program generates a skew number from the MAXCOUNT for each output signal of the respective multiple outputs of the DUT and calculates from the skew numbers the maximum output skew parameters OSLH, OSHL for a particular device.

In the preferred example, the threshold detector circuit is a threshold latch circuit for latching or not latching a count signal in response to an output from the comparator in excess of the threshold level. The threshold latch circuit includes a reset input for resetting the latch circuit. The controller is coupled to the reset input of the threshold latch circuit. The controller program controls the reset input of the threshold latch circuit each phase shift increment or step of the measurement signal for counting the steps until the output from the comparator falls below the threshold level.

The threshold latch circuit may be a tunnel diode latch circuit biased to latch a count signal each phase shift increment step of the measurement signal as long as the output signal from the comparator exceeds the threshold signal level of a tunnel diode in the latch circuit. In the preferred example embodiment, the threshold latch circuit is a NAND gate latch circuit which normally latches a count signal each phase shift increment step of the measurement signal as long as the output of the comparator exceeds the threshold level. The controller resets the NAND gate latch each phase shift increment step and counts the steps to the MAXCOUNT at which the phase comparator output falls below the threshold level. The controller resets the NAND gate latch with a square wave edge or preferably a "one shot" pulse. The phase comparator and NAND gate latch may be implemented in ECL at ECL voltage levels for high speed operation with appropriate TTL to ECL and ECL to TTL translators.

Alternatively, the threshold latch circuit may be, for example, a NAND gate latch circuit or other threshold voltage sensitive latch circuit coupled to remain unlatched as long as the output from the comparator exceeds a threshold level. Count signals are generated for each phase shift increment step while the NAND gate latch circuit remains unlatched. The NAND gate latch circuit latches to stop the count at MAXCOUNT when the output falls below the threshold level.

According to the best mode of the invention the square wave measurement signal generating circuit incorporates a digital synthesizer circuit for synthesizing a digital periodic wave signal at a test signal frequency using the clock signal as a generating signal. The clock signal has a generating signal frequency substantially higher than the test signal frequency. The test signal frequency and generating signal frequency are selected to afford at least a specified phase shift resolution for the synthesized digital periodic wave. A digital to analog converter is coupled to the digital synthesizer circuit for converting and smoothing the digital periodic wave signal to an analog periodic wave signal. A squarer circuit coupled to the DAC squares the analog periodic wave signal to generate a square wave measurement signal with well defined edges and with said specified phase shift resolution.

In the preferred embodiment, the digital synthesizer circuit is constructed for synthesizing a digital sine wave signal at the test signal frequency. The digital synthesizer circuit uses direct digital synthesis. That is, the digitized sine waveform is generated at the test signal frequency by accumulating phase changes at the higher clock signal generating signal frequency. The phase resolution of the synthesized measurement signal permits phase modulation of the measurement signal in phase increments or steps equal to the specified phase shift resolution.

For switching between and testing output skew for both edges (LH,HL) of the selected output signal, an output signal splitting circuit is coupled to the SPMT switch output for splitting the selected output signal into two split signals at first and second split outputs. An inverter is coupled to the first split signal output and double inverters are coupled to the second split signal output so that the split signals differ by approximately 180°. The split signals provide separate opposite going low to high (LH) and high to low (HL) edge split signals for generating separate skew numbers corresponding to OSLH and OSHL. Either of the split signal paths may be coupled through an edge definition circuit.

In this feature of the invention an edge definition circuit is coupled in the selected output signal circuit of the skew tester for improving resolution of the selected output signal of the DUT. For the edge definition circuit a tunnel diode circuit is coupled to receive the selected output signal. The tunnel diode circuit is biased to turn on to a conducting state at high switching speed in response to one edge of a square wave pulse of the selected output signal. The tunnel diode circuit turns off to a non-conducting state at high switching speed in response to the opposite edge of the square wave pulse. A current mirror may be used to provide a controlled current source to the tunnel diode.

According to the invention the programmable controller is programmed initially to offset or shift the phase of the measurement signal relative to the phases of the respective output signals outside the expected skew range of the output signals. The programmable controller defines a phase measurement range greater than the expected skew range. The phase measurement range is composed of a maximum number MAXNUM of phase increments or steps each equal to the specified phase resolution of the measurement signal. The MAXNUM of phase increments defines a phase measurement range greater than the number of steps or increments of phase comprising the expected skew range of the output signals of the DUT. The MAXCOUNT from measuring the difference in phase between the selected output signal and measurement signal is subtracted from the MAXNUM to provide a skew number for the selected output signal for comparison with corresponding skew numbers determined for other outputs. The skew range or maximum skew parameters OSLH,OSHL for the DUT can then be determined using the skew numbers.

According to the method for testing output skew the invention contemplates generating a standard clock signal; generating a square wave measurement signal at a test signal frequency synchronized with the standard clock signal frequency, and generating said square wave measurement signal with at least a specified phase shift resolution; and generating a square wave test signal at said test frequency using the same standard clock signal so that the test signal and measurement signal are synchronized in frequency. Further steps of the method include applying the square wave test signal at the input of a DUT thereby generating a plurality of output signals at the respective outputs of the DUT; selecting a first output signal from the DUT and comparing the phase of the first output signal with the phase of the measurement signal; measuring the difference in phase by shifting the phase of the measurement signal in phase increments or steps equal to the specified phase shift resolution of the measurement signal; and counting the phase increments to a maximum count MAXCOUNT. At the MAXCOUNT an edge of a pulse of the measurement signal substantially coincides with a corresponding edge of a pulse of the selected output signal. The method concludes by calculating a skew number from the MAXCOUNT, comparing with skew numbers from the other output signals, and determining the output skew range or maximum output skew parameters OSLH, OSHL of the DUT.

Characterizing the method in further detail the invention contemplates offsetting or shifting the phase of the measurement signal relative to the phases of the respective output signals outside the expected skew range of the output signals and defining a phase measurement range greater than the expected skew range. The phase measurement range comprises a maximum number MAXNUM of phase increments or steps equal to the specified phase resolution of the measurement signal. The steps further include measuring the difference in phase between the selected output signal and measurement signal by shifting the phase of the measurement signal in the selected phase increments or steps and counting the phase increments to a maximum count MAXCOUNT. At the MAXCOUNT an edge of a pulse of the measurement signal substantially coincides with a corresponding edge of a pulse of the output signal.

The programmatic steps of the invention contemplate subtracting the MAXCOUNT from the MAXNUM providing a skew number for the selected output signal for comparison with the skew numbers from other output signals of the DUT. The skew range or maximum output skew parameters OSLH, OSHL are then determined from the respective skew numbers. Other steps of the method include splitting the selected output signal into two split signals and inverting the split signals relative to each other providing separate opposite going LH and HL edge split signals for generating separate skew numbers for OSLH and OSHL; selecting one of the split signals for skew testing; increasing the resolution of the selected edge of the square wave pulse of the selected output signal using a tunnel diode circuit; filtering the selected output signal; comparing the phase of the selected output signal with the phase of the measurement signal; etc.

Other objects features and advantages of the invention are apparent in the following specification and accompanying drawings.

DESCRIPTION OF PREFERRED EXAMPLE EMBODIMENTS AND BEST MODE OF THE INVENTION

Figure 1:
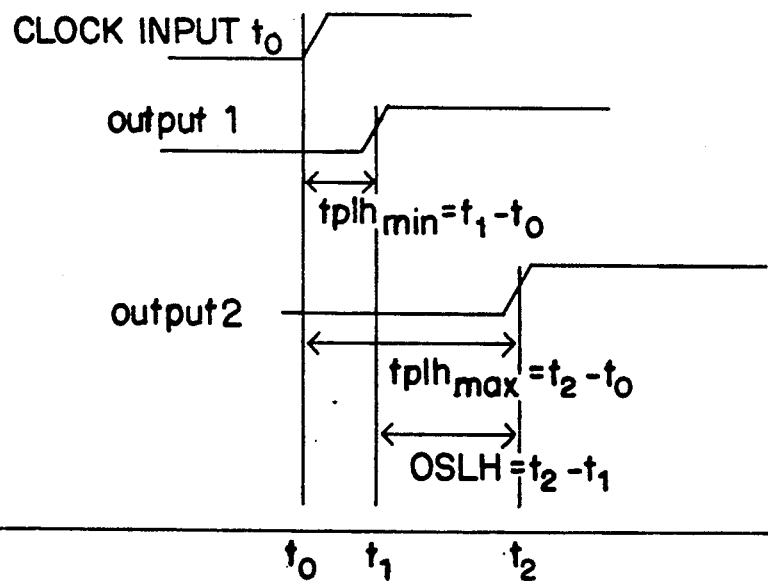
FIG. 1 is a timing diagram illustrating the conventional definition of the output skew parameter OSLH. for a single input multiple output clock driver circuit.
Figure 2:
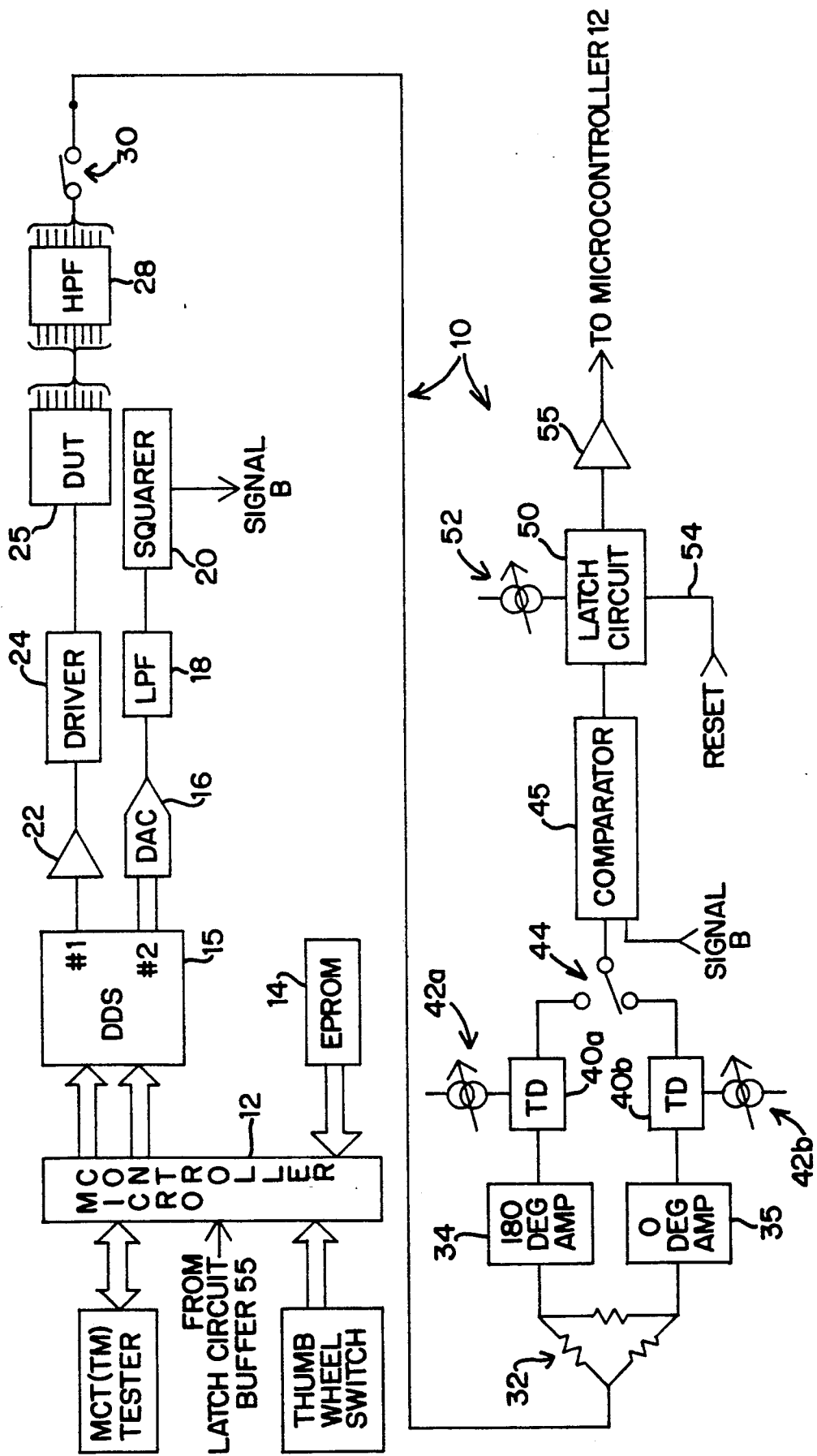
FIG. 2 is a block diagram of an output skew tester circuit according to the invention.

An output skew tester and measurement circuit 10 according to the invention is shown in the block diagram of FIG. 2. A programmable microcontroller 12 with erasable EPROM memory 14 is programmed as hereafter described to direct the output skew testing and measuring procedure. A Thumb Wheel Switch or other peripheral device is provided for data entry. The programmable microcontroller may be, for example, an AMD8051 microcontroller or an Intel microcontroller with inputs and outputs hereafter described.

The microcontroller provides essential controlling information over control and address lines for digital synthesis of the skew tester measurement signal by a direct digital synthesizer circuit 15. The direct digital synthesis part 15 is a Qualcomm Model Q2334 (TM) Dual Direct Digital Synthesizer (DDS) manufactured by and available from Qualcomm Incorporated, 10555 Sorrento Valley Road, San Diego, Calif. 92121-1617. The Qualcomm Q2334 (TM) DDS 15 provides two complete direct digital synthesizer circuits or channels #1 and #2 on the same chip 15.

Each DDS channel is able to generate a high resolution digitized sine wave signal using phase accumulation techniques combined with on-chip sine lookup. Each DDS circuit operates on the principle that a digitized wave form of a given frequency can be generated by accumulating phase changes at a higher frequency. Sampling theory requires that the generating frequency be greater than twice the frequency of the generated wave form frequency. The generating and generated signal frequencies may be selected to provide a digital sine wave synthesized by the DDS part with very fine frequency and phase resolution and control.

The two independent DDS channels #1 and #2 of DDS part 15 are controlled from a single microprocessor interface coupled to microcontroller 12. The microcontroller provides the control information for specifying the phase and frequency of the generated sine waves. It also controls the operating modes of the DDS part 15 for example for phase shift modulation or incrementing of the digitally synthesized wave as hereafter described. Synchronous inputs are provided to permit high resolution phase and frequency modulation of the generated wave forms. The microcontroller 12 may also be coupled to a conventional MCT (TM) Tester (MCT) for performing DC and AC function testing on a DUT in which case the skew testing circuit is disabled or transparent.

Figure 4:
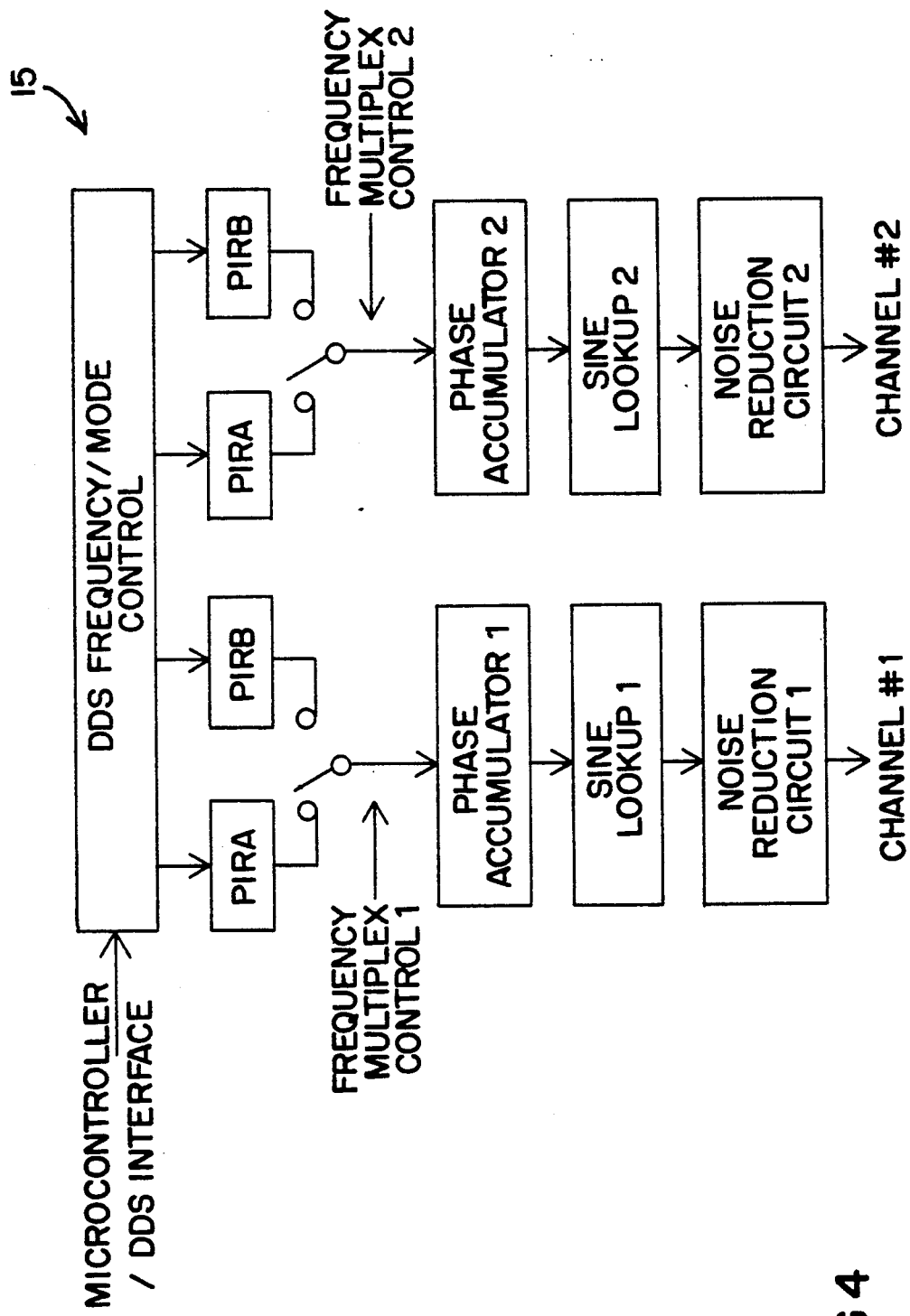
FIG. 4 is a block diagram showing major components of the direct digital synthesis IC block component of the block diagram of FIGS. 2 & 3.

A generalized block diagram showing essential elements of the internal structure of the Qualcomm Q2334(TM) DDS part 15 is illustrated in the block diagram of FIG. 4. In each channel, the phase increment or phase resolution value loaded through the DDS Frequency Mode Control and stored in Phase Increment Register A (PIRA) or B (PIRB) is added to the starting value in the Phase Accumulator once each clock period of the selected generating signal frequency. The sum of the starting value and phase increment value is converted to a digitized sine wave amplitude value by the Sine Lookup function block. The digital value is output from the respective DDS channels #1 and #2 through the Noise Reduction Circuit block.

The loading of example values in the respective DDS channels of the DDS part 15 is described hereafter with reference to the software directed procedures for the skew testing and measurement circuit 10. By way of example the system clock signal generator selected for the DDS part 15, may be selected to generate a clock signal frequency or generating signal frequency of 30.517579 Mhz. The phase increment value or phase number to be loaded in the Phase Increment Register A of channel #2 of DDS 15 is selected to generate a generated signal frequency, test signal frequency, or measurement signal frequency of 1.9043487 Mhz according to the following equation:

$$F_o = (F_c \times \text{Phase \#}) / 2^{32}$$

where $F_o$ is the synthesized digital sine wave output signal frequency or measurement signal frequency, $F_c$ is the frequency of the clock signal or generating signal frequency, the Phase # is the phase number increment value loaded in the Phase Increment Register A, and where the Phase Accumulator Register is a 32 bit register with a bit resolution of $2^{32}$.

Solving this equation for the Phase # to be entered in the Phase Increment Register A, the Phase # is 268435456, or 10000000 hexadecimal. This selection of numbers gives the desired measurement signal frequency at a test signal frequency of 1.9043487 Mhz. This selection of parameters produces a test signal frequency in a typical standard range for IC device testers.

The phase of the generated digital sine wave measurement signal may be incremented or modulated using the other Phase Increment Register B. For shifting or modulating the phase of the generated measurement signal, the phase increment value at a desired phase shift resolution is entered in Phase Increment Register B. The value to be added to the Phase Accumulator Register is then synchronously switched for one cycle from one Phase Increment Register to the other for an incremental shift in phase at the resolution entered in PIRB. By way of example, for phase increment steps of 15.2 $\mu°$ equivalent to 8 picoseconds (pS) at the generated measurement signal frequency of 1.9+Mhz, a phase number equivalent to an 8 pS phase increment is entered in the Phase Increment Register B. The microcontroller 12 can then direct the sequential stepping or shifting of phase of the generated measurement signal in phase increments or steps equal to the phase shift resolution entered in PIRB by switching between PIRA and PIRB upon command or in response to other signals as hereafter described.

Further details on the operation of the direct digital synthesizer circuits of the DDS part 15 are described in U.S. Pat. No. 4,905,177 for HIGH RESOLUTION PHASE TO SINE AMPLITUDE CONVERSION issued Feb. 27, 1990, and U.S. Pat. No. 4,901,265 for PSEUDORANDOM DITHER FOR FREQUENCY SYNTHESIS NOISE issued Feb. 13, 1990. Further information is also available from the Qualcomm Incorporated "Q2334 Dual Direct Digital Synthesizer Technical Data Sheet", June 1988, available from Qualcomm Incorporated at the address above.

Returning to the block diagram of FIG. 2, with the second channel of the DDS block 15 loaded with the control information as set forth above, a 1.9043487 Mhz digital sine wave is synthesized at the output of channel #2. The synthesized digital sine wave is then applied to a digital to analog converter DAC 16 for smoothing and through low pass filter LPF 18 to eliminate high frequency noise accompanying direct digital synthesis of the measurement signal. The squaring circuit 20 then provides a square wave measurement signal B with well defined high resolution edges and with a phase resolution of 8 pS or 15.2 $\mu°$ phase increments or steps.

Referring to channel #2 of the DDS block diagram of FIG. 4, the Phase Accumulator block is normally coupled to Phase Increment Register A for synthesizing and generating the digital sine wave at 1.9+Mhz. Phase modulation or phase incrementing of the measurement signal is achieved by momentary synchronous switching of the Phase Accumulator register of Channel #2 from Phase Increment Register A to the Phase Increment Register B, modulating or incrementing the phase of the measurement signal by a phase resolution step of 15.2 microdegrees equivalent to 8 pS at the 1.9+Mhz test signal frequency. This mode of operation of the Q2334 (TM) DDS part 15 is described as internal phase modulation and achieves phase incrementing or phase modulation through this differential phase shift increment adjustment procedure.

The phase number loaded in PIRA is used by the Phase Accumulator register for generating the basic synthesized or generated measurement signal at the test signal frequency of 1.9+Mhz without further phase modulation. The PIRB Register is loaded with the phase increment value for phase modulation which is actually the addition of the basic phase number or phase increment value stored in the PIRA Register plus the phase number for the value of the desired additional phase increment or offset, in the example above 8 pS or 15.2 $\mu°$. The Phase Accumulator Register uses the PIRA register for most phase accumulations in synthesizing the generated measurement signal at the test signal frequency. The phase increment value in the PIRB Register is then used only once for a cycle when directed by the microcontroller to cause the desired phase increment, step, or offset for the next period. The PIRB Register is loaded each time a phase increment or phase modulation step is directed by the microcontroller 12 for introducing an incremental phase step at the phase shift resolution specified by PIRB. The Q2334 (TM) DDS part is able to achieve this switching between the registers PIRA and PIRB synchronously, inserting the selected high resolution phase shift then returning to the basic generated signal synthesizing mode.

The test signal path of the skew tester 10 is coupled to the channel #1 output of the DDS part 15 as illustrated in the block diagram of FIG. 2. The digital wave form synthesizing capability of channel #1 however is not utilized. The test signal path buffer 22 is coupled only to the most significant bit (MSB) output pin of channel #1. In channel #1 the Phase Increment Register A is loaded with the same 10000000 hexadecimal number, and Phase Increment Register B is not loaded. Since channel #1 and channel #2 are coupled to the same system clock at 30.517579 Mhz, channel #1 generates a simple square wave test signal at the test signal frequency of 1.9043487 Mhz. The simple square wave test signal from channel #1 and the digitally synthesized measurement signal of channel #2 are therefore synchronized in frequency. From the channel #1 output buffer circuit 22, the square wave test signal is applied by a driver circuit 24 at the input pin of a device under test DUT 25. The driver circuit 24 may be for example a high speed tristate pin driver such as the model PT-403 pin driver manufactured by Pulse Instruments, 1234 Francisco Street, Torrance, Calif. 90502. In the tristate mode, the driver circuit 24 becomes invisible to a conventional MCT (TM) (MCT) tester coupled to the microcontroller 12. The MCT tester can then perform conventional AC and DC parameter tests and dynamic function tests. In the bistate mode of operation, the driver circuit 24 preempts the DUT for output skew testing and measurement.

Referring to the block diagram of FIG. 2, the DUT 25 is a one pin to eight pin clock driver circuit delivering eight secondary clock output signals respectively at eight outputs of the device. The multiple outputs pass through respective high pass filters 28 for eliminating low frequency noise, to a single pole multi-throw switch 30 for selecting one of the DUT output signals. Such a multiple input single output switch may be provided for example by a DAICO Switch Model DS0820 (TM), a single pole ten throw SP10T switch in which eight of the inputs are coupled to the eight outputs of the DUT through the respective low pass filters 28. The microcontroller 12 controls sequential selection of output signals from the DUT 25 for skew testing.

The power of the selected output signal is then split into first and second split output signals through a delta network 32. The first split output signal passes through a single inverter amplifier 34 while the second split output signal passes through a double inverter amplifier 35 composed of the first and second inverter buffer amps 35a and 35b. (See FIG. 5). Amplifiers 34 and 35 are wideband high frequency fast amplifiers such as Avantek amplifiers. The signal splitting network 32 and out of phase inverting amplifiers 34 and 35 therefore provide split output signals 180° out of phase with respect to each other for testing and measuring skew for both low to high (LH) and high to low (HL) edge transitions. The split output signal (LH or HL) is selected for testing by SPDT switch 44.

The upper and lower split signal paths are coupled to the high speed switching tunnel diode circuits 40a and 40b to provide greater edge definition. The tunnel diode circuits 40a and 40b each incorporate a tunnel diode having a characteristic triggering or turn on current $I_p$. The tunnel diodes in circuits 40a and 40b are biased with current from current sources 42a and 42b at a current level just below the turn on current or threshold current $I_p$. Occurrence of an LH edge transition at the anode of the tunnel diode circuit 40a from the upper split path inverting amplifier 34 causes a high speed turn on transition of tunnel diode circuit 40a with a sharpened LH edge. Similarly, HL edges are sharpened by tunnel diode circuit 40b.

The selected split output signal with increased edge definition at the output of either tunnel diode circuit 40a or 40b is applied at one of the inputs of comparator 45. At the other input of comparator 45 is coupled the measurement signal B from squaring network 20 of the measurement signal path from channel #2 of the DDS part 15 as shown in the block diagram of FIG. 2. Comparator 45 is a phase comparator such as an exclusive OR gate generic designation 7486 comparator. The comparator 45 delivers a fast pulse output with a signal which varies according to the difference in phase between the selected output signal and the measurement signal B at the inputs of the comparator.

The output of the comparator 45 is in turn applied to a threshold detector circuit 50 in the form of a latch circuit such as a sensitive high speed tunnel diode latch circuit 50. The tunnel diode of TD latch circuit 50 is biased by current source 52 to turn on and latch a count signal at the output of the TD latch through TTL output buffer circuit 55 to the microcontroller 12. The microcontroller 12 in turn controls reset of the TD latch circuit 50 through the reset input 54.

As long as the difference in phase between the selected output signal and measurement signal causes an output from the comparator 45 which exceeds the threshold level of threshold detector circuit 50, the TD latch circuit 50 transmits a count signal to the microcontroller 12 which then resets the tunnel diode latch 50. At the same time the microcontroller through control of the direct digital synthesis function of channel #2 of DDS part 15 initiates a phase modulation increment step of for example an LH edge of the measurement signal toward a corresponding LH edge of the selected output signal. At some subsequent count designated MAXCOUNT the corresponding LH edges substantially coincide and the amplitude of the output of comparator 45 falls below the threshold level of threshold detector circuit 50. Incremental stepping of the phase of the measurement signal under control of microcontroller 12 therefore stops and the MAXCOUNT is used for determining a skew number for the selected output of the DUT as hereafter described.

Figure 3:
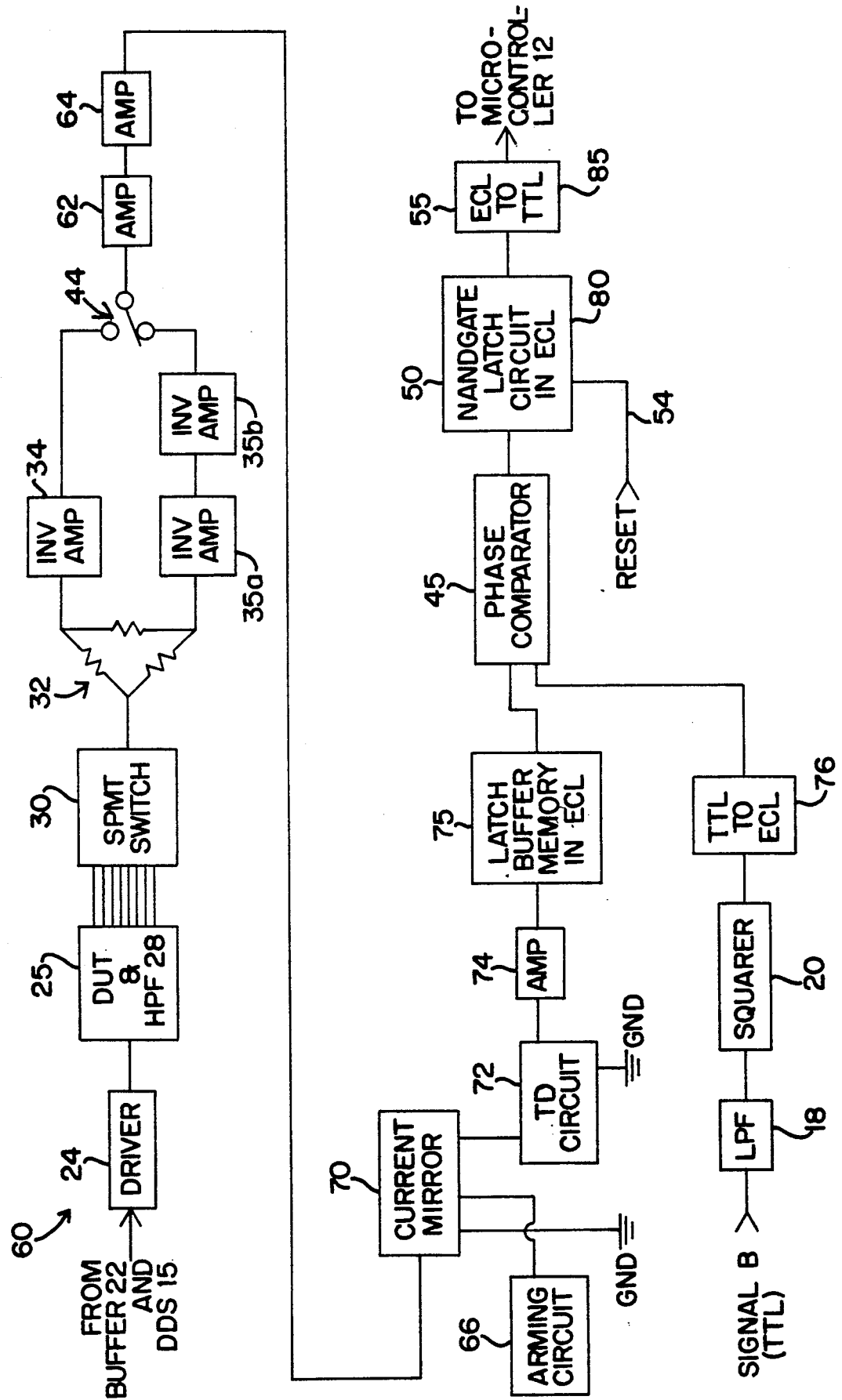
FIG. 3 is a block diagram of the preferred example output skew tester.

A preferred example skew tester 60 is illustrated in the block diagram of FIG. 3 in which component elements performing the same function as those in the block diagram of FIG. 2 are indicated by the same reference numerals and designations. The block diagram of FIG. 3 is a fragmentary block diagram beginning at the end of the digital section of the upper portion of the block diagram of FIG. 2 at the driver circuit 24. The block diagram of FIG. 3 follows the test signal path from the DUT driver 24 through to the phase comparator 45, threshold latch circuit 50, and further circuitry. At the phase comparator 45 the measurement signal B is also applied at the input with the selected output signal but with further processing as hereafter described. The portions of the digital section of the skew tester block diagram of FIG. 2 omitted in the fragmentary block diagram of FIG. 3 remain the same, performing the same functions as described above.

Figure 5A:
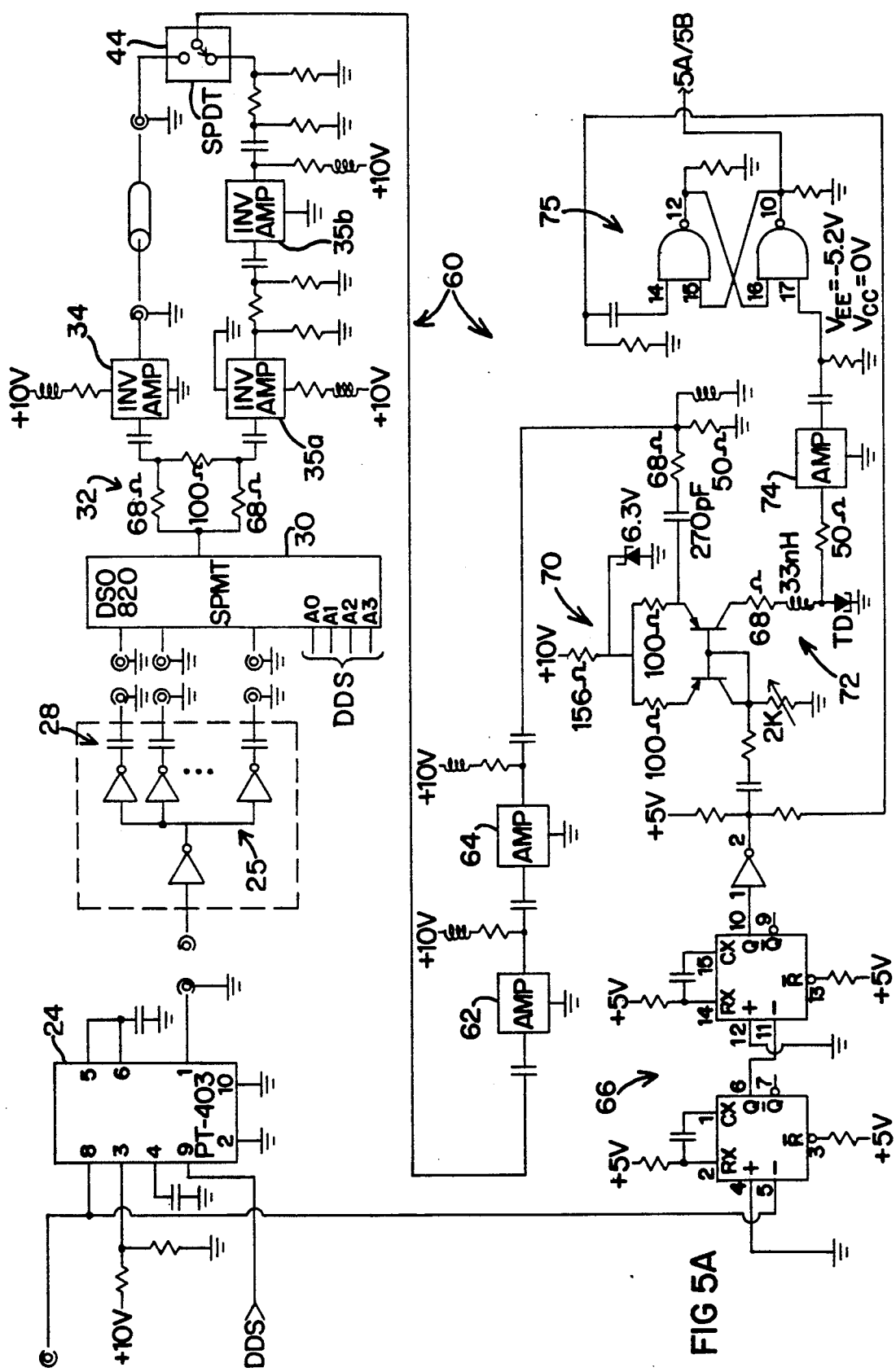
FIG. 5 is a detailed schematic circuit diagram of the test signal and selected output signal path in the block diagram of FIG. 3 from the first output of the direct digital synthesis circuit block.
Figure 5B:
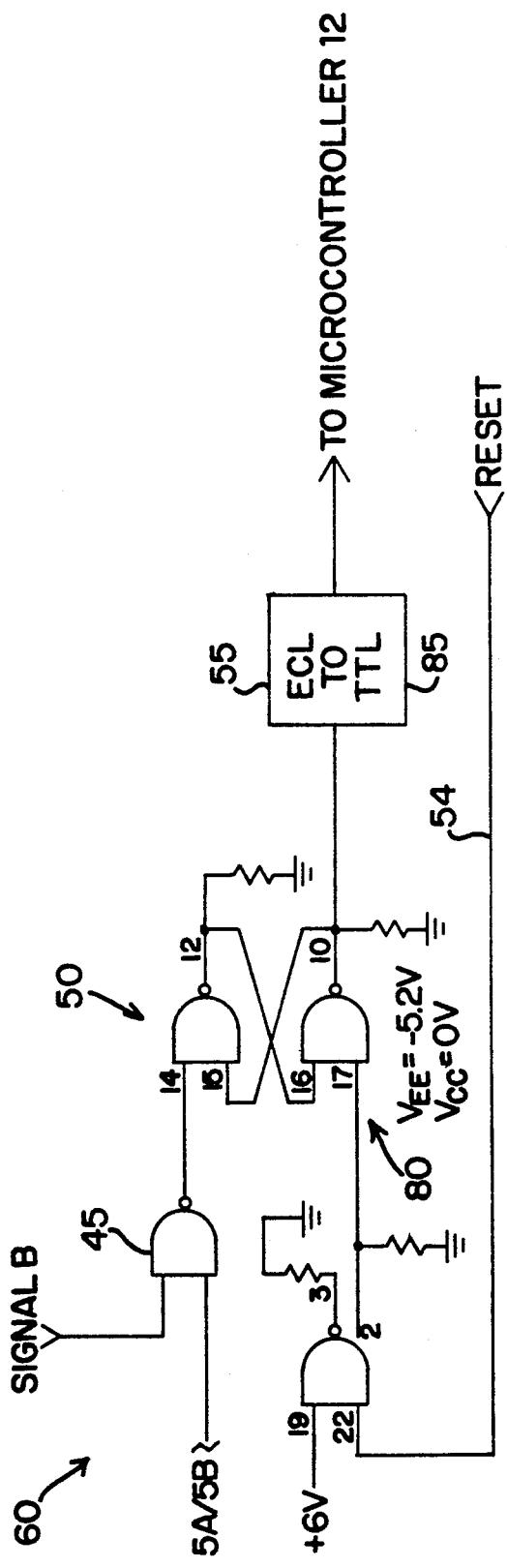
Figure 6:
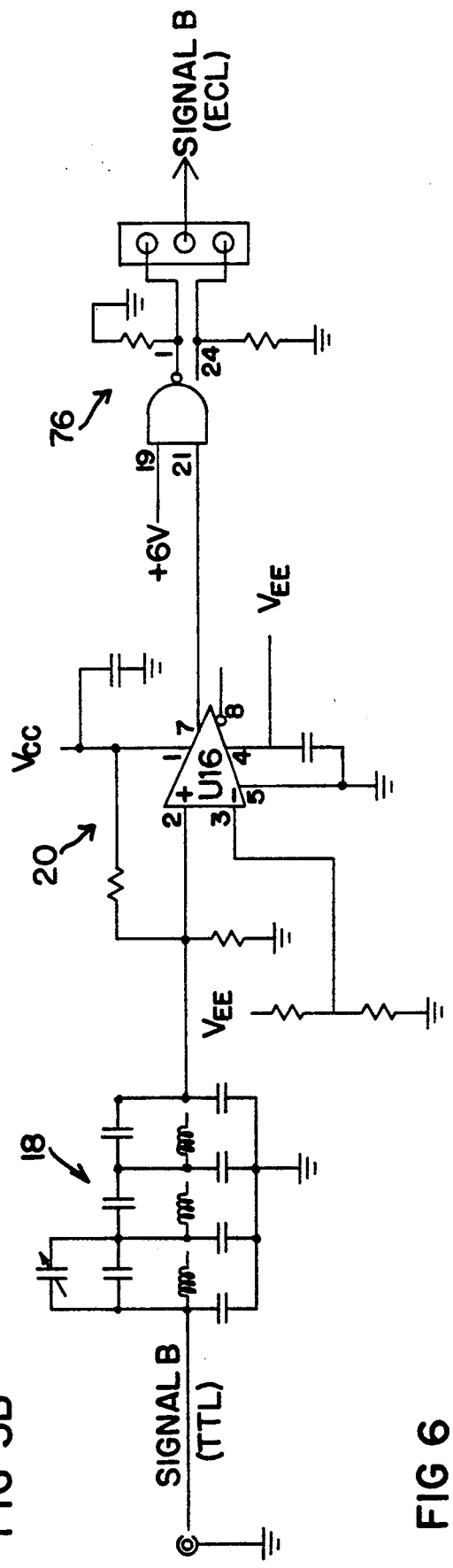
FIG. 6 is a detailed schematic circuit diagram of the measurement signal conditioning and TTL to ECL translating circuit portion of the block diagram of FIG. 3.

Referring at the same time to the block diagram of FIG. 3 and the detailed schematic circuit diagram implementation of the block diagram of FIG. 3 illustrated in FIGS. 5 & 6, the test signal generated by the DDS 15 on channel #1 and available at the channel #1 output buffer 22 is applied by the driver circuit 24 at the input of the device under test 25. The DUT 25 is, for example, a one bit to eight bit clock driver with eight output lines coupled to the single pole multi-throw switch 30. The DUT board for DUT 25 may incorporate the high pass filters 28 at each of the output lines from the DUT 25. As heretofore described, one of the output signals is selected by the SPMT switch 30 and passes on the single output line to the delta network 32 which splits the power of the selected output signal into two split signal paths. SPDT switch 44 selects one of the split output signals which are 180° out of phase with respect to each other all as earlier described with reference to FIG. 2.

The further test signal path of the preferred example skew tester 60 differs from the previous skew tester block diagram of FIG. 2 as illustrated in FIG. 3. The gain of the selected split output signal is enhanced by buffer circuit amplifiers 62 and 64 for switching voltage levels in a second current branch or slave current branch of a current mirror circuit 70. The master current branch of current mirror 70 seeks to maintain a constant mirroring current in the branches of the current mirror.

In the second branch or slave branch of the current mirror, a tunnel diode circuit 72 is coupled to provide greater edge definition to the selected output signal. The tunnel diode circuit 72 switches to the conductive state upon application of an HL edge of the selected output signal applied by amplifier 64 to the second branch of the current mirror 70. The anode side of tunnel diode circuit 72 switches at higher speed providing a selected output signal with greater edge definition at the amplifier buffer circuit 74. An arming circuit 66 is coupled to the current mirror circuit 70 for resetting the tunnel diode of the tunnel diode circuit 72.

The selected output signal with greater edge definition is temporarily stored in the memory buffer latch circuit 75 for coupling to one of the inputs of the phase comparator 45. To maintain the high speed, high resolution edge definition of the selected output signal, the temporary memory latch circuit 75 may be implemented in emitter coupled logic (ECL) at ECL voltage levels. The measurement signal B must therefore also be conditioned and translated to ECL voltage levels as further shown in the block diagram of FIG. 3 and the detailed schematic circuit diagram implementation of FIG. 6. The measurement signal B generated at channel #2 of DDS 15 and the output of DAC 16 is applied through the low pass filter 18, squaring circuit 20 and TTL to ECL voltage level translator circuit 76 to the second input of the phase comparator 45.

In the example of FIG. 3 the latch circuit 50 is a NAND gate latch circuit 80 implemented in emitter coupled logic at ECL voltage levels. As heretofore described, as long as the output of phase comparator 45 exceeds the threshold voltage level of NAND gate latch circuit 80, the latch circuit latches a count signal which returns through ECL to TTL translator circuit 85 and buffer 55 to the microcontroller 12. The NAND gate latch circuit 80 is reset by the microcontroller on reset line after each phase shift increment step until the phases of the selected output signal and measurement signal substantially coincide and the MAXCOUNT for the selected output has been determined.

In the skew tester illustrated in FIGS. 3, 5 and 6 the measurement signal B applied to one of the inputs of phase comparator 45 is a square wave signal for implementing phase measurement with reference to one edge of the square wave signal, for example the LH edge or the HL edge. According to a further alternative example, the square wave measurement signal B is first coupled through a one shot multivibrator for triggering a narrow pulse on the LH edge of the square wave measurement signal. The narrow pulse generated on the falling edge of the square wave measurement signal B is then applied to phase comparator 45 and the phase measurement is made with reference to the pulse signal.

Alternatively, a NAND gate latch circuit may be constructed in the test signal path circuit so that it is normally not latching during the counting steps. According to this example the comparator 45 is selected to be a NAND gate comparator circuit with a normally low output when the phases of the selected output signal and measurement signal differ. Upon substantial coincidence of the phases of the selected output signal and measurement signal the output of such a NAND gate comparator then rises actuating the NAND gate latch circuit. Latching of the NAND gate latch circuit in turn stops the incremental phase modulations of the measurement signal by the microcontroller 12 at the MAXCOUNT signal just the opposite of the TD latch circuit 50 of FIG. 2 and the NAND gate latch circuit 80 of FIG. 3.

According to this alternative embodiment, the selected output signal from the split signal output at SPDT switch 44 is applied through an emitter follower and inverting buffer to the NAND gate comparator. The emitter follower transistor element and buffer eliminate extra or spurious pulses that may accompany the selected output signal edge. The measurement signal input to the NAND gate comparator may also be buffered through a one shot multivibrator to limit extraneous edges or extra pulses. A further advantage of the alternative embodiment using a NAND gate comparator 45 and a NAND gate latch circuit 50 is that the microcontroller initiates and counts phase increments for measurement of phase difference between the selected output signal and measurement signal during non-latching or non-triggering of the voltage sensitive NAND gate latch circuit. The latching time delay is therefore avoided for higher speed operation of the skew tester during measurement of phase in the selected phase resolution increments. The NAND gate latch circuit latches upon substantial coincidence of an edge of a pulse of the measurement signal with a corresponding edge of a pulse of the selected output signal. The microcontroller then stops the phase modulation increments and counting of steps at the MAXCOUNT.

Figure 7A:
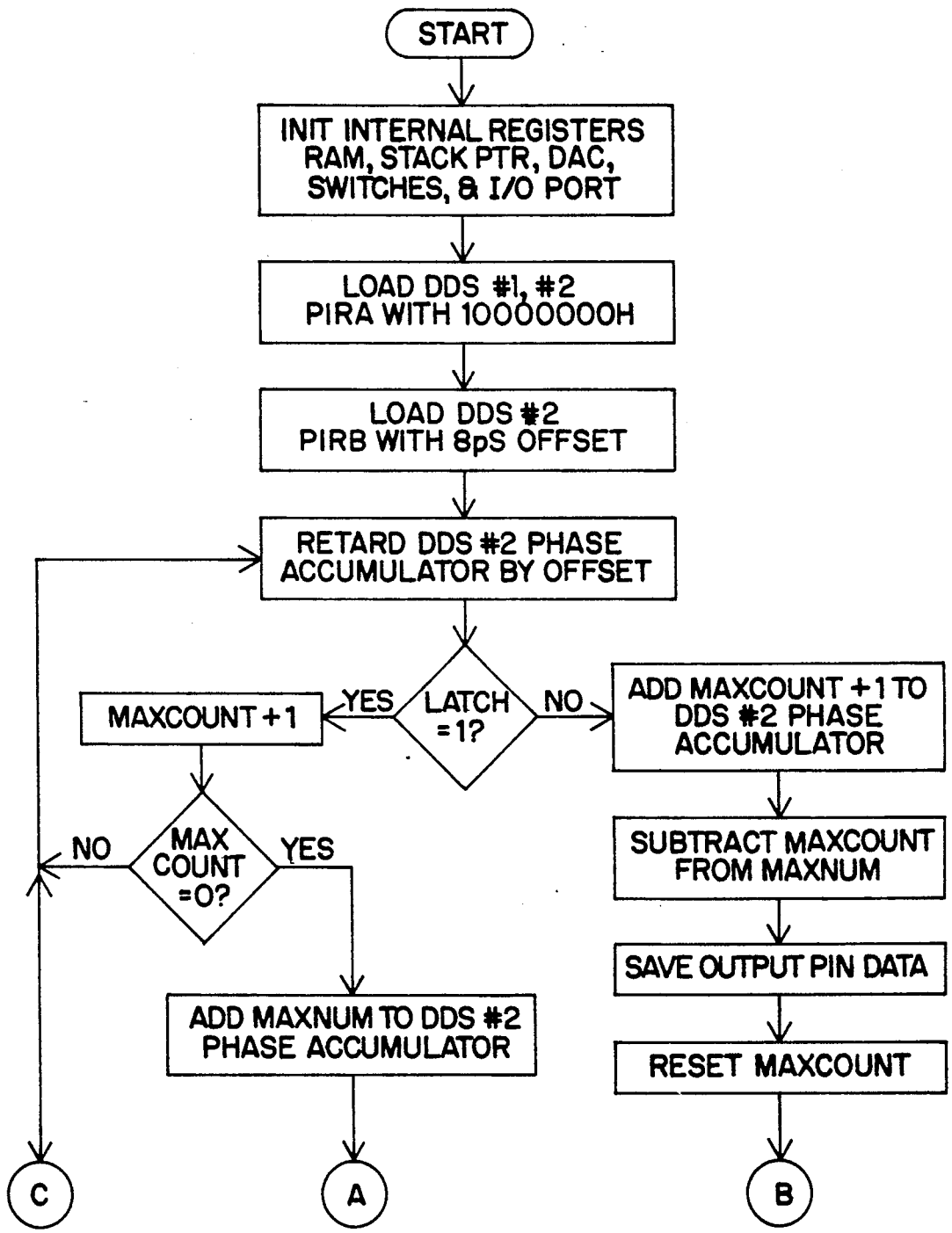
FIGS. 7A and 7B are programmatic flow charts showing the firmware or software of the programmable microcontroller and EPROM memory for directing the skew testing and measurement steps according to the invention.
Figure 7B:
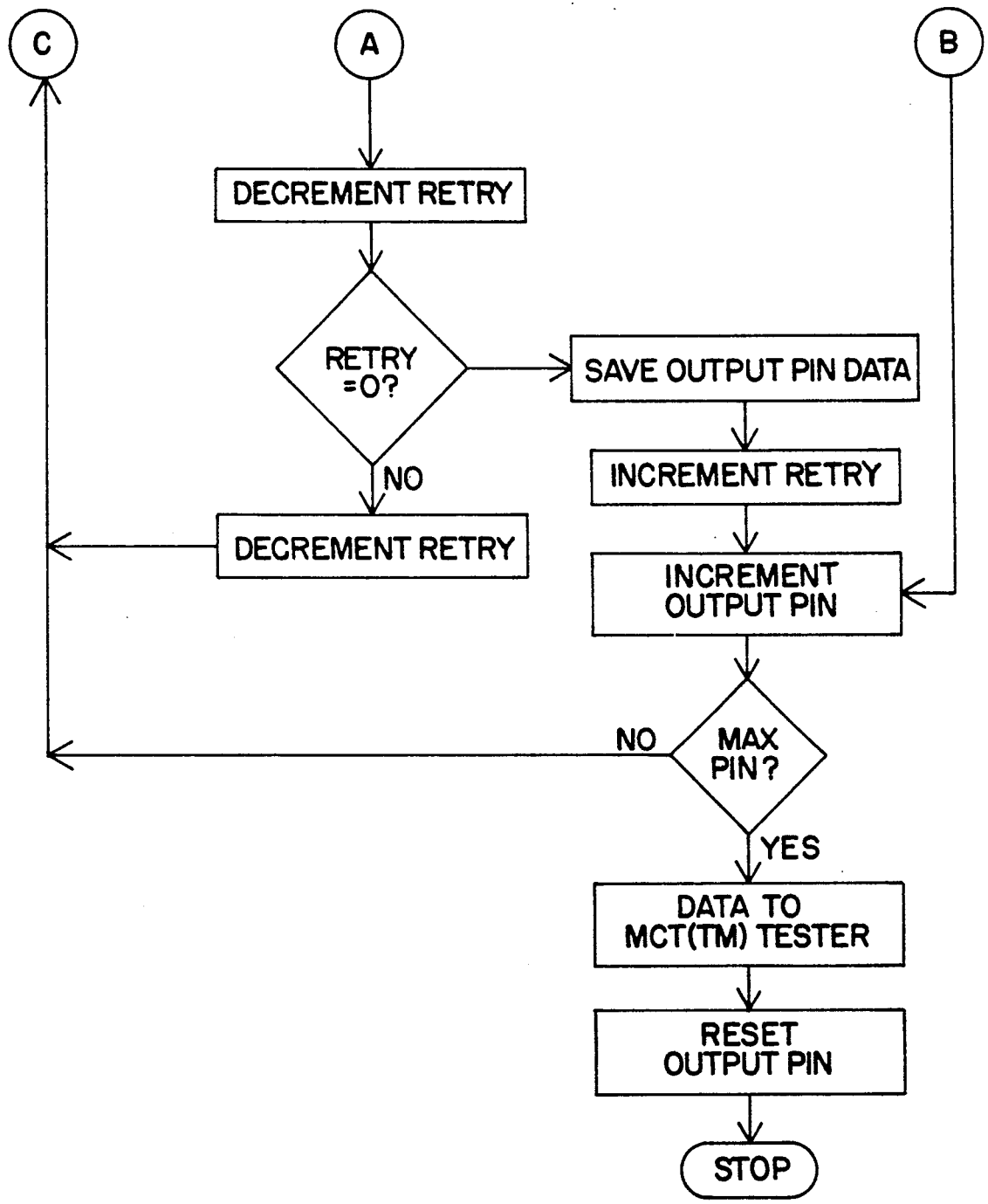
Figure 8:
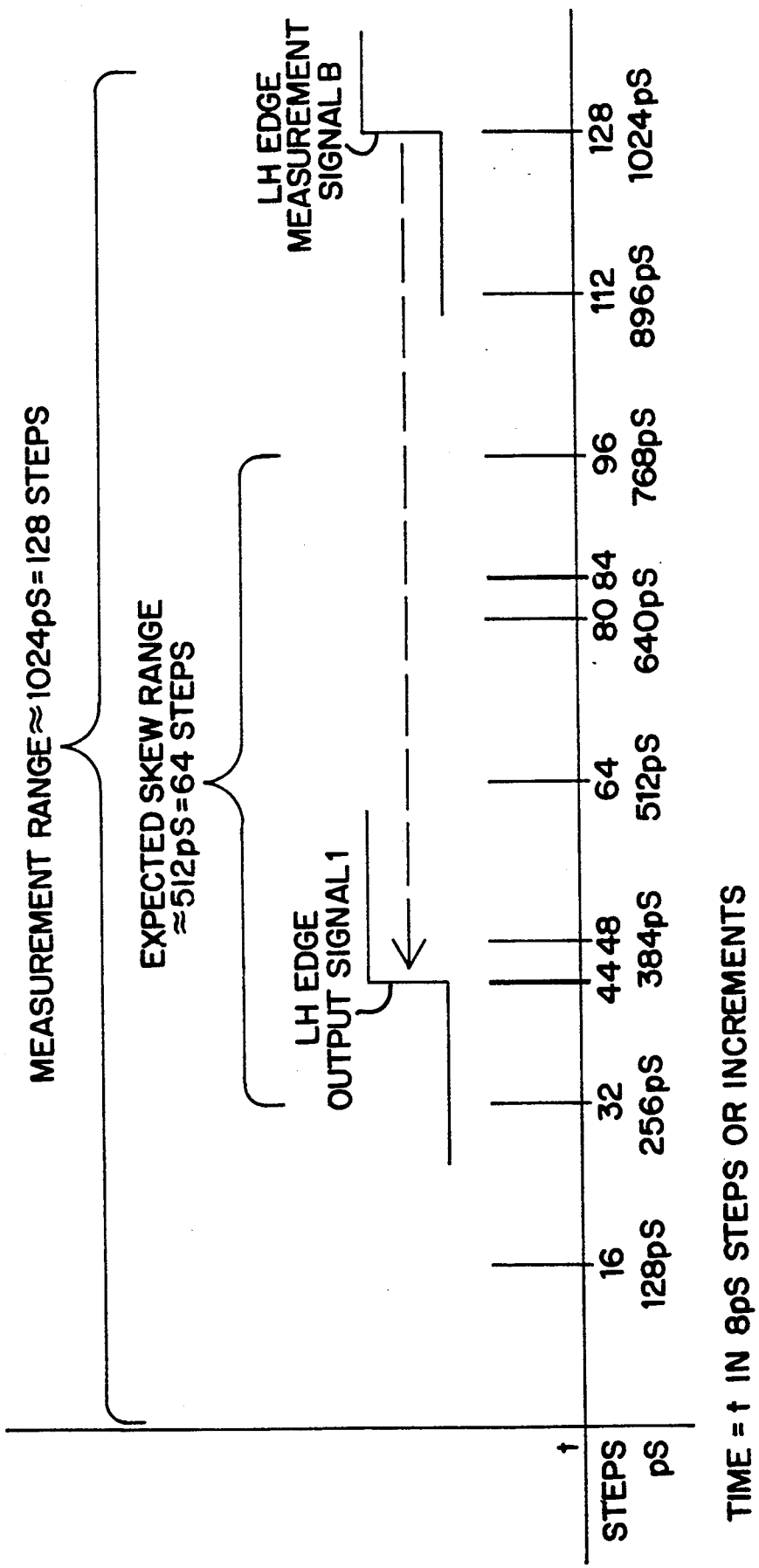
FIG. 8 is a diagrammatic graph for illustrating the skew testing and measurement sequence directed by the microcontroller program software.

Operation of the preferred embodiment of the skew tester illustrated in FIGS. 3 and 5 is hereafter described with reference to the skew tester system software illustrated in FIG. 7A and 7B and the system operational timing diagram of FIG. 8. The software or firmware stored in the EPROM 14 of microcontroller 12 initiates a skew testing and measurement procedure sequence for a DUT by setting the internal registers of the direct digital synthesizer 15; and by initializing the RAM memory of the microcontroller, the RAM stack pointer which stores return addresses to the RAM, the digital to analog DAC 16 and the input output port of the microcontroller. The microcontroller also sets the switches i.e. the SP10T switch 30 for selecting one of the output signals of the DUT for testing, and the SPDT switch 44 for selecting either an LH edge or an HL edge of the selected output signal.

The microcontroller then loads Phase Increment Registers A in both channel #1 and channel #2 of the DDS 15 with the selected phase number for synthesizing the test signal in channel 1 and the measurement signal in channel 2 synchronized at the desired test signal frequency. In this example for a test signal frequency of 1.9043487 Mhz generated by a clock generating signal frequency of 30.517579 Mhz, the decimal phase number is 268435456 which translates to the hexadecimal number 10000000. The phase number 10000000 hex is therefore loaded in both the registers PIRA respectively of channels 1 and 2.

For high resolution phase modulation incrementing of the measurement signal from channel #2 of the DDS 15, a phase number for incrementing the phase of the measurement signal relative to the test signal by 8 pS is entered in the Phase Increment Register B of channel #2 of DDS 15. It is noted that only the register PIRB of channel #2 is loaded with a phase increment number. The PIRB register of channel #1 is not loaded as the phase of the test signal is not incremented and is used as a reference. More specifically PIRB of channel #2 is loaded with a phase number equal to the phase number in PIRA plus a phase number equal to the further phase shift increment of 8 pS or 15.2 $\mu°$.

It is noted that the square wave test signal generated at the output of channel #1 of DDS 15 and the measurement signal generated at the output of channel #2 are synchronized in frequency by the common clock signal. Because of the synchronism in frequency between the test signal and measurement signal, the phase measurements and phase increments are referred to in units of time of, for example, 8 pS because this is always equivalent to 15.2 microdegrees of phase at the selected test signal frequency of 1.9+Mhz. At the selected test signal frequency the period of one cycle of the test signal is 526 nS. The 8 pS phase increments therefore provide an extremely high resolution of approximately 65,789 steps or increments in one period of a cycle or phase of the test signal frequency, that is, approximately $2^{16}$ steps in a period.

For high speed low skew parts such as the National Semiconductor Corporation Model Z2525 or J2525 1 bit to 8 bit clock drivers, the output timing skew between corresponding edges of pulses at the respective outputs is expected to be, for example, no more than 1 nS or a very small fraction of the phase of one period of 526 nS of a cycle at the test signal frequency. In fact for a low skew part the anticipated or expected spread or skew at the output may be, for example, in the range of less than 1 nS, for example as low as 250 pS–500 pS. At the selected test signal frequency of 1.9+Mhz this low skew is measured in the high resolution increments of 8 pS equivalent to 15.2 microdegrees of phase of a 360° phase period or cycle.

In the next step implemented by the microcontroller software, the phase of the measurement signal in channel #2 is offset from the phase of the test signal by an amount greater than the expected skew range for the output signals from the multiple outputs of the DUT. Referring to FIG. 8 by way of example, it is anticipated that a device under test may have an expected skew range of approximately no more than 0.512 nS or 512 pS, equivalent to 64 steps or phase increments of the selected phase shift resolution of 8 pS. The phase of the measurement signal from channel #2 of DDS 15 may therefore be delayed or displaced 1.024 nS (1,024 pS) equivalent to 128 steps or phase increments for measurement over this range. The microcontroller therefore defines a measurement range, in this instance of 128 steps (1,024 pS) substantially greater than the expected skew range of 512 pS or 64 steps between output signals from the multiple outputs. The measurement range is also referred to as the maximum number of steps or MAXNUM.

The measurement range may be adjusted empirically on the basis of initial tests to take into account delays interposed by the skew tester components themselves. Thus, if the skew testing components introduce variation in delays between the test signal and measurement signal of for example + or −1 nS, the measurement range may be extended by delaying or stepping out the measurement signal a total of 256 steps or 2.048 nS (2,048 pS). Because the skew tester must measure the full difference in phase between the edge of the measurement signal and a corresponding edge of the selected output signal for each output of the DUT, the larger the measurement range, the greater the time that is required to complete the skew testing and measurement. Empirical example can therefore be used to minimize the measurement range while still maintaining an adequate measurement range greater than expected skew range and delays interposed by skew tester components.

The microcontroller 12 checks the output of NAND gate latch circuit. If it is latching with an output 1, the microcontroller continues with the measurement procedure by resetting the latch circuit. The latch circuit again latches a high output as long as the output from comparator 45 exceeds the threshold detected by the latch circuit. The output of comparator 45 remains above this threshold as long as it "sees" a sufficient difference in phase detected between the selected output signal and measurement signal.

According to the software procedure the maximum count is therefore incremented by 1 and as long as the MAXCOUNT is non-zero, the microcontroller decrements the phase of the measurement signal in a phase increment equal to the phase shift resolution dictated by the Phase Increment Register B. According to the present example the phase is decremented by 8 pS or 15.2 microdegrees. This cycle continues, counting the phase increments until the phases of the selected output signal and measurement signal substantially coincide and the output of the latch circuit goes to low or 0.

The measurement signal is then returned by the Phase Accumulator register to its full MAXNUM offset position in preparation for the next measurement. A skew number for the current selected output and output signal is calculated by subtracting the MAXCOUNT number from the MAXNUM and this skew number data is saved corresponding to the selected output pin of the DUT. Concurrently the pin data is incremented for selecting the next output of the DUT. When the maximum pin number, i.e. pin number 8 corresponding to output 8 of the DUT has been counted, all skew number data for the respective output pins is passed to the original IC device tester, such as an MCT tester coupled to the input/output port of the microcontroller 12. From this skew number data, the maximum output timing skew parameters OSLH and OSHL are calculated.

As shown in the flow chart if the measurement signal is stepped the full 128 phase increments of the phase measurement range without change in the latch circuit output, the MAXCOUNT returns to 0 and the microcontroller acknowledges a test failure. The microcontroller then delays or steps out the measurement signal the full MAXNUM width of the measurement range of 128 steps to retry the test sequence.

While the invention has been described with reference to particular example embodiments, it is intended to cover all modifications and equivalents within the scope of the following claims.

I claim:

1. A skew tester for testing output skew between multiple output signals of an integrated circuit (IC) device under test (DUT) having an input and multiple outputs comprising:
    a clock signal circuit for generating a clock signal;
    a measurement signal generator generating a square wave measurement signal at a test signal frequency synchronized with the clock signal, said measurement signal generator generating a square wave measurement signal having a specified phase shift resolution;
    said measurement signal generator comprising a direct digital synthesizer circuit constructed to synthesize a periodic wave signal by phase accumulation of selected high resolution phase increment values at said specified phase shift resolution;
    a test signal generator generating a square wave test signal at the test signal frequency using the same clock signal so that the test signal and measurement signal frequencies are synchronized;
    a DUT coupling circuit for coupling an input and multiple outputs of a DUT in the skew tester and for driving an input of the DUT with said test signal;
    a switch coupled to the DUT coupling circuit for selecting an output signal from one of the multiple outputs of a DUT through the DUT coupling circuit;
    a comparator having a first input coupled to receive the selected output signal and a second input coupled to receive the measurement signal, said comparator generating an output according to the difference in phase between the selected output signal and the measurement signal;
    and a controller coupled to the comparator and measurement signal generator, said controller being programmed for shifting the phase of the measurement signal toward the phase of the selected output signal in phase shift increments or steps equal to the selected high resolution phase increment values generated by the direct digital synthesizer circuit at said specified phase shift resolution during occurrence of count signals and counting said phase shift increments to a maximum count (MAXCOUNT) at which the phase of an edge of a pulse of the measurement signal substantially coincides with the phase of a corresponding edge of a pulse of the selected output signal;
    said controller comprising program means for generating a skew number from the MAXCOUNT for each output signal of the DUT and for calculating a maximum output skew (OSHL, OSLH) or skew range for a DUT from the skew numbers of the respective multiple outputs of the DUT by direct comparison of said skew numbers with respect to each other.

2. The skew tester of claim 1 comprising a threshold detector circuit coupled to the output of the comparator for delivering a count signal in response to an output from the comparator in excess of a threshold level; and wherein the threshold detector circuit comprises a threshold latch circuit latching in response to a signal from the comparator above or below said threshold level, said threshold latch circuit having a reset input for resetting the latch circuit.

3. The skew tester of claim 2 wherein the threshold latch circuit comprises a NAND gate latch circuit biased to latch a count signal as long as the output signal from the comparator exceeds a threshold signal level of the NAND gate latch circuit;
    said controller being coupled to the reset input of the threshold latch circuit for resetting the threshold latch circuit, said program directing reset of the threshold latch circuit each phase shift increment or step of the measurement signal at said selected high resolution phase increment values having the specified phase shift resolution until the output from the comparator falls below said threshold level.

4. A skew tester for testing output skew between output signals of an integrated circuit (IC) device under test (DUT) having an input and multiple outputs comprising:
    a clock signal circuit for generating a clock signal;
    a direct digital synthesizer circuit for synthesizing a digital periodic wave signal at a test signal frequency using the clock signal as a generating signal, said clock signal having a generating signal frequency substantially higher than the test signal frequency, said test signal frequency and said generating signal frequency being selected to afford a specified phase shift resolution for the synthesized digital periodic wave;
    said direct digital synthesizer circuit being constructed to synthesize said digital periodic wave signal by phase accumulation of selected high resolution phase increment values at said specified phase shift resolution;
    a digital to analog converter (DAC) coupled to the digital synthesizer circuit for converting and smoothing the digital periodic wave signal to an analog periodic wave signal;
    a squarer circuit coupled to the DAC for squaring the analog periodic wave signal to generate a square wave measurement signal with well defined edges and with said specified phase shift resolution;
    a test signal generator generating a square wave test signal at the test signal frequency using the same clock signal means so that the test signal and measurement signal are synchronized in frequency;
    a DUT coupling circuit for coupling an input and multiple outputs of a DUT in the skew tester and for driving an input of the DUT with said square wave test signal, said DUT generating at the multiple outputs a plurality of output signals skewed in time relative to each over a skew range characteristic of the DUT;

a single pole multi-throw (SPMT) switch having multiple inputs coupled to the multiple outputs of a DUT through said DUT coupling circuit for selecting and switching to one of the multiple outputs of the DUT for testing;

a comparator having a first input coupled to receive the selected output signal and a second input coupled to receive the measurement signal, said comparator generating an output varying according to the difference in phase between the selected output signal and the measurement signal at the inputs of the comparator;

a threshold detector circuit coupled to the output of the comparator, said detector circuit delivering a count signal in response to a signal from the comparator in excess of a threshold level;

a programmable controller coupled to the direct digital synthesizer circuit for controlling synthesis of the digital periodic wave and for shifting the phase of the resulting square wave measurement signal in phase shift increments or steps equal to said selected high resolution phase increment values generated by the direct digital synthesis circuit at said specified phase shift resolution, said programmable controller also being coupled to the threshold detector circuit;

said programmable controller also comprising program means for shifting the phase of the measurement signal toward the phase of the selected output signal in said phase shift increments or steps having the same selected high resolution phase increment values generated by the direct digital synthesizer at the specified phase shift resolution during occurrence of a count signal, for counting said phase shift increments to a maximum count (MAXCOUNT) at which the phase of an edge of a pulse of the measurement signal substantially coincides with the phase of a corresponding edge of a pulse of the selected output signal causing an output from the comparator below said threshold level, and for directing calculation of a skew related number from the MAXCOUNT for the selected output signal;

said programmable controller comprising program means for directing calculation of maximum output skew parameters OSHL, OSLH for a DUT from direct comparison with each other of the skew related numbers for the respective multiple outputs of the DUT.

5. The skew tester of claim 4 wherein the threshold detector circuit comprises a threshold latch circuit latching in response to a signal from the comparator above or below said threshold level, said threshold latch circuit having a reset input for resetting the latch circuit.

6. The skew tester of claim 5 wherein the threshold latch circuit comprises a NAND gate latch circuit biased to latch a count signal as long as the output signal from the comparator exceeds a threshold signal level of the NAND gate latch circuit;

said programmable controller being coupled to the reset input of the threshold latch circuit for resetting the threshold latch circuit, said program means directing reset of the threshold latch circuit each phase shift increment step of the measurement signal until occurrence of an output from the comparator below said threshold level.

7. The skew tester of claim 5 wherein the threshold latch circuit is a tunnel diode latch circuit.

8. The skew tester of claim 4 wherein the digital synthesizer is constructed to synthesize for the digital periodic wave signal, a digital sine wave signal at the test signal frequency using the clock signal as a generating signal.

9. The skew tester of claim 4 further comprising an edge definition circuit including a tunnel diode circuit coupled to receive the selected output signal and being biased to turn on to a conducting state at high switching speed in response to one edge of a square wave pulse of the selected output signal and to turn off to a non-conducting state at high switching speed in response to the opposite edge of the square wave pulse thereby providing higher resolution edges.

10. The skew tester of claim 9 further comprising an output signal splitting circuit coupled to the SPMT switch for splitting the selected output signal into two split signals coupled to first and second split signal paths, an inverter coupled in the first split signal path and double inverters coupled in the second split signal path so that the split signals differ by approximately 180° thereby providing separate opposite going low to high (LH) and high to low (HL) edge split signals for generating separate skew numbers corresponding to OSLH and OSHL; a solid state switch having first and second inputs coupled respectively to the first and second split signal paths, and a switch output coupled to the edge definition circuit; and wherein the edge definition circuit is coupled to an input of the comparator.

11. The skew tester of claim 4 further comprising a low pass filter coupled between the output of the DAC and the input of the squarer, and high pass filter coupled between the multiple outputs of a DUT through said DUT coupling circuit and the inputs of the SPMT switch.

12. The skew tester of claim 4 wherein the programmable controller comprises program means for initially offsetting or shifting the phase of the measurement signal relative to the phases of the respective output signals outside the expected skew range of the output signals, said program means defining a phase measurement range greater than the expected skew range comprising a maximum number MAXNUM of phase increments or steps each equal to the selected high resolution phase increment values generated by the direct digital synthesizer circuit at said specified phase shift resolution of the measurement signal, said program means directing subtraction of MAXCOUNT from MAXNUM to provide said skew number for the selected output signal for said direct comparison with corresponding skew numbers for other of the output signals.

13. A method for testing output skew between output signals of an integrated circuit (IC) device under test (DUT) having an input and multiple outputs comprising:

generating a standard clock signal;

generating a square wave measurement signal at a test signal frequency synchronized with the standard clock signal frequency and generating said square wave measurement signal with at least a specified phase shift resolution by direct digital synthesis of the measurement signal, said direct digital synthesis comprising accumulating selected high resolution phase increment values at said specified phase shift resolution;

generating a square wave test signal at said test signal frequency using the same standard clock signal so that the test signal and measurement signal are synchronized in frequency;

applying the square wave test signal at the input of a DUT thereby generating a plurality of output signals at the respective output of the DUT;

selecting a first output signal from the DUT and comparing the phase of the first output signal with the phase of the measurement signal;

measuring the difference in phase by shifting the phase of the measurement signal in phase increments or steps equal to the selected high resolution phase increment values generated by said direct digital synthesis at said specified phase shift resolution of the measurement signal and counting the phase increments to a maximum count (MAXCOUNT) at which an edge of a pulse of the measurement signal substantially coincides with a corresponding edge of a pulse of the selected output signal;

calculating a skew related number from the MAXCOUNT for comparison with corresponding skew related numbers calculated from other output signals of the DUT for determining the skew range or maximum skew OSLH, OSHL of the DUT;

and calculating maximum output skew (OSLH,OSHL) by direct comparison of the skew related numbers with each other.

14. The method of claim 13 wherein the step of comparing the phases of the first output signal and the measurement signal comprises the steps of applying the selected output signal to an edge definition tunnel diode circuit biased to turn on to a conducting state in response to one edge of a pulse of the output signal and to turn off to a non-conducting state in response to the opposite edge of a square wave pulse of the output signal, said tunnel diode circuit providing high resolution edges for the output signal for phase comparison with the measurement signal;

applying the output signal from the tunnel diode circuit and the measurement signal at inputs of a phase comparator, said phase comparator generating an output signal according to the difference in phase between corresponding edges of pulses of the selected output signal and measurement signal;

wherein the output of the comparator is coupled to a latch biased to a latch circuit constructed to latch a count signal as long as the output signal from the comparator exceeds a threshold of the latch circuit and comprising the steps of resetting the latch circuit after each phase increment step during measurement of the phase difference between the selected output signal and measurement signal for generating a count signal to a MAXCOUNT signal, and using the MAXCOUNT signal to generate a skew related number for the selected output signal;

and programming a microcontroller to receive the latch circuit output and to control the measurement of phase difference between the selected output signal and measurement signal by controlling the phase shift of the measurement signal in said phase increments or steps at said selected high resolution phase increment values generated during digital synthesis of the square wave measurement signal.

15. A method for testing output skew between output signals of an integrated circuit (IC) device under test (DUT) having an input and multiple outputs comprising:

digitally synthesizing a square wave measurement signal at a selected test signal frequency by direct digital synthesis of a digital periodic wave signal having the test signal frequency using a clock signal as a generating signal, said direct digital synthesis comprising accumulating selected high resolution phase increment values at a specified phase shift resolution said clock signal having a generating signal frequency substantially higher than the test signal frequency, said test signal frequency and said generating signal frequency being selected to afford at least said specified phase shift resolution for the synthesized digital periodic wave, converting the digital periodic wave signal to an analog periodic wave signal, filtering the analog periodic wave signal through a low pass filter, and squaring the filtered analog periodic wave signal to generate the square wave measurement signal with well defined edges and with said specified phase shift resolution;

generating a square wave test signal at said test signal frequency using the same clock signal so that the square wave test signal and square wave measurement signal are synchronized in frequency;

applying the square wave test signal at the input of a DUT thereby generating a plurality of output signals at the respective output of the DUT, said output signals being skewed in time relative to each other over an expected skew range characteristic of the DUT;

shifting the phase of the measurement signal relative to the phases of the respective output signals outside the expected skew range of the output signals and defining a phase measurement range greater than the expected skew range, said phase measurement range comprising a maximum number (MAXNUM) of phase increments or steps of the measurement signal, each phase increment equal to the selected high resolution phase increment values generated by the direct digital synthesis at said specified phase shift resolution of the measurement signal, said MAXNUM of phase increments defining a phase measurement range greater than the number of increments of phase comprising the expected skew range of the output signals of the DUT;

selecting an output signal from the DUT, comparing the phase of the selected output signal with the phase of the measurement signal, and measuring the difference in phase by shifting the phase of the measurement signal in said phase increments at the selected high resolution phase increment values generated by the direct digital synthesis and counting the phase increments to a maximum count (MAXCOUNT) at which an edge of a pulse of the measurement signal substantially coincides with a corresponding edge of a pulse of the output signal;

subtracting the MAXCOUNT from the MAXNUM providing a skew number for the selected output signal for comparison with corresponding skew numbers from other output signals of the DUT and for determining the skew range or maximum output skew parameters OSLH, OSHL of the DUT;

and calculating the maximum output skew parameters OSLH, OSHL by direct comparison of said skew numbers from respective output signals with each other.

16. The method of claim 15 wherein the step of selecting a first output signal from the DUT comprises selecting a low to high (LH) edge of a pulse of the first output signal and comparing the phase of the LH edge with the phase of a corresponding LH edge of a pulse of the measurement signal for generating a skew number for calculating the LH output skew parameter OSLH.

17. The method of claim 16 comprising further steps of selecting a high to low (HL) edge of a pulse of the first output signal and comparing the phase of the HL edge with the phase of a corresponding HL edge of a pulse of the measurement signal for generating a skew number for calculating the HL output skew parameter OSHL.

18. The method of claim 19 comprising the steps of selecting further output signals from the DUT and generating respective skew numbers for calculating OSLH and OSHL by direct comparison of respective skew numbers for each output of the DUT.

19. The method of claim 15 comprising the step of increasing the resolution of the edges of square wave pulses of the selected output signal.

20. The method of claim 19 wherein the step of increasing the resolution comprises applying the selected output signal to a tunnel diode circuit.

21. The method of claim 20 wherein the step of comparing the phases of the first output signal and the measurement signal comprises the steps of applying the selected output signal to an edge definition tunnel diode circuit biased to turn on to a conducting state in response to one edge of a pulse of the output signal and to turn off to a non-conducting state in response to the opposite edge of a square wave pulse of the output signal, said tunnel diode circuit providing high resolution edges for the output signal for phase comparison with the measurement signal, applying the output signal from the tunnel diode circuit and the measurement signal at inputs of a phase comparator, said phase comparator generating an output signal according to the difference in phase between corresponding edges of pulses of the selected output signal and measurement signal.

22. The method of claim 21 wherein the output of the comparator is coupled to a latch circuit constructed to latch a count signal as long as the output signal from the comparator exceeds a threshold signal of the latch circuit, and comprising the steps of resetting the TD latch after each phase increment step during measurement of the phase difference between the selected output signal and measurement signal for generating a sequential count signal to a MAXCOUNT signal, and using the MAXCOUNT signal to generate a skew number for the selected output signal.

23. The method of claim 21 wherein the step of selecting an output signal from the DUT comprises coupling the multiple outputs of the DUT to a single pole multi-throw switch with multiple inputs and a single output, and switching one of the switch inputs to the switch output for delivering the selected output signal, and further comprising the steps of splitting the selected output signal into two split signals, inverting one of the split signals and double inverting the other so that the split signals differ by 180°, thereby providing separate opposite going LH and HL edge split signals, and generating separate skew numbers for OSLH and OSHL.

24. The method of claim 23 comprising the step of increasing the resolution of the selected LH or HL edge split signal using a tunnel diode circuit.

25. The method of claim 22 comprising the steps of programming a microcontroller to receive the latch circuit output and to control the measurement of phase difference between the selected output signal and measurement signal by controlling and modulating the phase shift of the measurement signal in said phase increment steps with the same selected high resolution phase increment values generated during direct digital synthesis of the square wave measurement signal.

* * * * *